(12) United States Patent
Shan

(10) Patent No.: US 6,207,590 B1
(45) Date of Patent: Mar. 27, 2001

(54) METHOD FOR DEPOSITION OF HIGH STRESS SILICON DIOXIDE USING SILANE BASED DUAL FREQUENCY PECVD PROCESS

(75) Inventor: Jesse Chien-Hua Shan, Vancouver, WA (US)

(73) Assignee: Wafertech, Inc., Camas, WA (US)

( * ) Notice: Subject to any disclaimer, the term of this patent is extended or adjusted under 35 U.S.C. 154(b) by 0 days.

(21) Appl. No.: 09/443,881

(22) Filed: Nov. 19, 1999

(51) Int. Cl.[7] .................................................. H01L 21/31
(52) U.S. Cl. ............................................ 438/788; 438/787
(58) Field of Search .................................... 438/787, 788; 118/723 R, 723 MP, 723 E

(56) References Cited

U.S. PATENT DOCUMENTS

| | | | |
|---|---|---|---|
| 5,904,566 | * | 5/1999 | Tao et al. ............................... 438/689 |
| 6,041,734 | * | 3/2000 | Raoux et al. ...................... 118/723 E |
| 6,077,764 | * | 6/2000 | Sugiarto et al. ...................... 438/597 |

* cited by examiner

Primary Examiner—John F. Niebling
Assistant Examiner—Alexander G. Ghyka
(74) Attorney, Agent, or Firm—Blakely, Sokoloff, Taylor & Zafman LLP

(57) ABSTRACT

A method of forming a silicon dioxide layer in a process chamber is disclosed. The process comprises: flowing silane into the process chamber; flowing $N_2O$ into the process chamber; generating a RF signal at a first predetermined power at a first frequency; and generating a RF signal at a second predetermined power at a second frequency.

2 Claims, 1 Drawing Sheet

METHOD FOR DEPOSITION OF HIGH STRESS SILICON DIOXIDE USING SILANE BASED DUAL FREQUENCY PECVD PROCESS

FIELD OF THE INVENTION

The present invention generally relates to semiconductor manufacturing processes, and more particularly, to a method for forming a silicon dioxide layer using silane in a plasma enhanced chemical vapor deposition (PECVD) process.

BACKGROUND OF THE INVENTION

Interlayer (ILD) and intermetal (IMD) dielectric layers are commonly used to isolate conducting structures, such as metal layers, from subsequently deposited conducting layers. The interlayer and intermetal dielectric layers are typically formed using some type of silicate glass, whether it be borophosphosilicate glass (BPSG), tetraethylorthosilicate (TEOS), spin-on-glass (SOG), or chemical vapor deposition (CVD) silicon oxide. These oxides are also used in a variety of other semiconductor applications, such as passivation layers, as diffusion and implantation masks, and as capping layers. Thus, the efficient formation of oxides is an important part of the semiconductor manufacturing process.

One of the more popular and useful types of oxide is silicon dioxide that is deposited using a plasma enhanced CVD process (PECVD). For example, the silicon dioxide may be deposited using a PECVD apparatus, such as the Centura machine manufactured by Applied Materials. The PECVD process is dependent upon many factors, including temperature, pressure, gas composition, gas flow rate, RF power density, frequency, and duty cycle.

By varying the parameters upon which the PECVD oxide is formed, the "quality" of the oxide can be varied. In particular, the refractive index (n) of the oxide is often used as an indicator of quality. Thermal oxide has a refractive index of 1.46. A value of n greater than 1.46 indicates a silicon rich film, while smaller values indicate a low density, porous film. Nevertheless, for the so-called "bulk oxide" layer of an intermetal dielectric, a value of n of about 1.46 is adequate and indeed preferred. The requirement of the refractive index in many IMD applications is 1.46±0.015 for the reason of (1) electrical performance, and (2) process integrity. This is because most photolithography processes (that will inevitably be performed after deposition of the bulk oxide layer) are optimized for an index of refraction of about 1.46. Thus, while for some applications, a high index of refraction is preferred, for bulk oxide applications, an index of refraction in the 1.46 range is preferred.

Another measure of the quality of a silicon dioxide film is its resistance to compressive strength. Typically, conventional CVD oxides can withstand a stress level of 1E+09 dynes/cm$^2$. It is preferable that the oxide have a high resistance to stress to prevent cracking. Furthermore, because PECVD oxide is used in many applications, in addition to the quality of the oxide, the process and speed by which it is formed is of great concern to reduce manufacturing cost. Semiconductor processes are constantly being examined for ways to increase throughput. Thus, the present invention provides a method for forming a high quality PECVD oxide having greater throughput and efficiency over conventional PECVD processes.

SUMMARY OF THE INVENTION

A method of forming a silicon dioxide layer in a silane based plasma enhanced chemical vapor deposition process is disclosed. The process comprises: flowing silane into said process chamber; flowing N$_2$O into said process chamber; generating a RF signal at a first predetermined power at a first frequency; and generating a RF signal at a second predetermined power at a second frequency.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawing, wherein.

DETAILED DESCRIPTION OF THE PREFERRED EMBODIMENT

Figure 1:
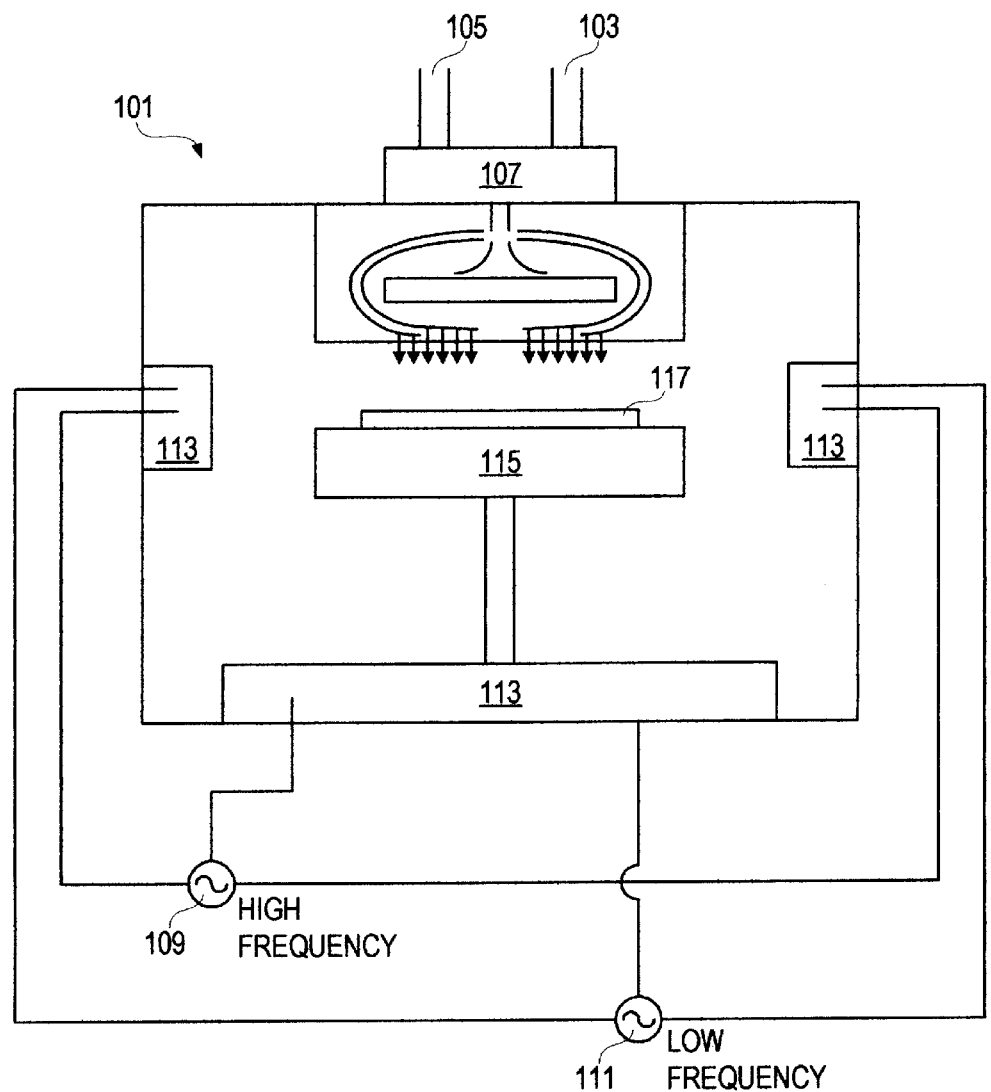
FIG. 1 is a schematic diagram of a PECVD process chamber used to implement the present invention.

The throughput of an oxide deposition process is governed by three components: (1) robot transfer time (about 10%), (2) process deposition time (about 45%), and (3) chamber cleaning process time (about 45%). Portions (1) and (3) are generally fixed. Therefore, one way to increase throughput is by decreasing the process deposition time. In other words, the deposition rate of the silicon dioxide should be increased to increase throughput. The present invention discloses a method for increasing the deposition rate of silane based silicon dioxide. Indeed, as will be seen below, the deposition rate of the oxide compared to the prior art is increased by about 90%. This corresponds to an increase of 20% in the overall throughput rate of the process.

A conventional silane based PECVD process deposits silicon dioxide film using a single frequency plasma power, typically a high frequency 13.56 MHz RF generator. The present invention modifies this process by using a dual frequency plasma power. In other words, not only is high frequency power applied, but also low frequency plasma power is applied through a low frequency RF generator.

FIG. 1 shows a schematic diagram of a PECVD process chamber adapted for implementing the method of the present invention. The process chamber 101 includes a high frequency RF generator 109 and a low frequency RF generator 111. Preferably, the high frequency RF generator 109 generates RF power at a frequency of greater than 10 MHz and more preferably 13.56 MHz. Preferably, the low frequency RF generator 11 generates RF power at a frequency of less than 1 MHz and more preferably 350 KHz.

The process chamber 101 includes a silane gas line 103 and a N$_2$O line 105 that inputs into a gas mixing chamber 107 of the PECVD apparatus. Although not shown, from the gas mixing chamber 107, the silane and N$_2$O gases are routed to a "showerhead style" nozzle on the top of the process chamber 101. Also, along the sides and bottom of the process chamber 101 are various RF power delivery devices 113 that take the input from the high frequency RF generator 109 and the low frequency RF generator 111 and applies it to the plasma in the process chamber 101. Finally, a wafer support 115 is provided for holding a wafer 117 in the proper position.

In accordance with the present invention, in order to deposit a high quality silicon dioxide layer on a wafer, the wafer 117 is placed on the wafer support 115 and silane and N$_2$O gas are flowed into the process chamber 101. The high frequency RF generator 109 and the low frequency RF generator 111 are activated to generate a plasma in the process chamber 101. This causes the deposition of silicon dioxide onto the wafer 117.

Specifically, the following process parameters are preferred for forming the silicon dioxide in accordance with the present invention:

|  | Power - High Frequency | Power - Low Frequency | $SiH_4$ (sccm) | $N_2O$ (sccm) |
|---|---|---|---|---|
| Preferred Embodiment | 435 watts | 250 watts | 200–230 | 1800–2100 |

The process is performed preferably at a temperature of 400° C. and a pressure of about 2.5 Torr. More preferably, the flow rate of $SiH_4$ is 210 sccm and the flow rate of $N_2O$ is 2000 sccm.

Under the above flow rate, pressure, dual frequency plasma power, and temperature conditions, it has been found that the deposition rate of silicon dioxide is significantly increased. In fact, the following results have been experimentally found for the method of the present invention, a conventional single frequency approach, and a prior art dual frequency approach:

| Recipe | Dep. Rate (Ang/min) | U% | Index of Refrac. | Stress | Throughput (WPH) | CMP Rate (Ang/min) |
|---|---|---|---|---|---|---|
| Preferred Embodiment | 17741 | 0.66 | 1.47 | 195E + 09 | 50 | 3350 |
| Single Frequency CVD Oxide | 9127 | 0.87 | 1.473 | 8.3E + 08 | 41 | 3610 |
| Dual Frequency PECVD Oxide | 20567 | 0.47 | 1.50 | 1.28E + 09 |  |  |

Note that as compared to prior art methods, the present invention produces a bulk oxide layer that: (1) has an index of refraction preferred for bulk oxides, (2) is highly resistant to stress, and (3) can be deposited at a high rate. It is the combination of all three of these attributes that make the method of the present invention advantageous over the prior art. Additionally, the parameter U% is a measure of the uniformity of the deposition process. In this case, the uniformity of the present invention is 0.66%, which is well within normal process requirements.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a silicon dioxide layer in a process chamber using a silane based plasma enhanced chemical vapor deposition process comprising:

flowing silane into said process chamber at a rate between 200–230 sccm;

flowing $N_2O$ into said process chamber at a rate between 1800–2100 sccm;

generating a RF signal of about 435 watts at a first frequency of about 13.56 MHz; and generating a RF signal of about 250 watts at a second frequency of about 350 MHz.

2. A method of forming a silicon dioxide layer in a process chamber using a silane based plasma enhanced chemical vapor deposition process comprising:

setting said process chamber to about 2.5 torr and about 400° C.;

flowing silane into said process chamber at a rate between 200–230 sccm;

flowing $N_2O$ into said process chamber at a rate between 1800–2100 sccm;

generating a RF signal of about 435 watts at a first frequency of about 13.56 MHz; and generating a RF signal of about 250 watts at a second frequency of about 350 MHz.

* * * * *